US006727692B2

(12) United States Patent
Ciureanu et al.

(10) Patent No.: US 6,727,692 B2
(45) Date of Patent: Apr. 27, 2004

(54) MAGNETIC FIELD SENSOR WITH ENHANCED SENSITIVITY, INTERNAL BIASING AND MAGNETIC MEMORY

(76) Inventors: Petru Ciureanu, 2850 Métivier, Saint-Laurent, Québec (CA), H4K 1J4; Piotr Rudkowski, 3 Blue Jays, Dollard-des-Ormeaux, Québec (CA), H9A 3H4; Arthur Yelon, 4700 de Maisonneuve W., Westmount, Québec (CA), H3Z 1M1

( * ) Notice: Subject to any disclaimer, the term of this patent is extended or adjusted under 35 U.S.C. 154(b) by 4 days.

(21) Appl. No.: 10/074,232

(22) Filed: Feb. 14, 2002

(65) Prior Publication Data

US 2002/0135364 A1 Sep. 26, 2002

Related U.S. Application Data

(60) Provisional application No. 60/268,702, filed on Feb. 15, 2001.

(51) Int. Cl.$^7$ ................................................ G01R 33/02
(52) U.S. Cl. ..................................... 324/249; 324/260
(58) Field of Search ................................ 324/249, 244, 324/260; 72/371; 365/133, 135, 137; 428/611, 615, 617

(56) References Cited

U.S. PATENT DOCUMENTS

| | | | |
|---|---|---|---|
| 3,892,118 A | * | 7/1975 | Wiegand ................... 72/371 |
| 5,003,291 A | | 3/1991 | Strom-Olsen et al. |
| 5,831,432 A | | 11/1998 | Mohri |
| 5,994,899 A | | 11/1999 | Mohri |
| 6,069,475 A | | 5/2000 | Isomura et al. |
| 6,097,183 A | | 8/2000 | Goetz et al. |
| 6,121,770 A | | 9/2000 | Sudo |

OTHER PUBLICATIONS

P. Ciureanu et al.; J. Appl. Phys., 79, 5136 (1996).
M. Vazquez et al.; IEEE Trans. Magn., 35, 3358 (1999).
I. Ogasawara and S. Ueno; IEEE Trans, Magn. 31, 1219 (1995).
P. Ciureanu et al.; IEEE Trans. Magn., 19, 2251 (1993).
D. Menard et al.; J. Appl. Phys., 83, 6566 (1998).

* cited by examiner

Primary Examiner—Walter E. Snow

(57) ABSTRACT

A high sensitivity magnetic field sensor is described. The sensing element is a stress-sensitive, negative-magnetostriction, melt-extracted amorphous wire, in which a strong magneto-impendance effect develops when the wire is connected to conventional electronic circuitry, which can be an impedance-meter. An a.c. current is provided to the wire and its relative change in impedance is measured. Simultaneously, the wire is submitted to a longitudinal d.c. magnetic field, H. A saturating d.c. field pulse is also applied to this wire at the beginning of the operating cycle. Tensile stress is further generated in the wire by pulling one end of the wire with a given force. This stress can be fine-tuned for sensitivity and bias with the help of a suitable mechanism. All these elements are packaged in a rugged non-magnetic enclosure, which permits easy and reliable connection of the sensor to said conventional electronic circuitry.

13 Claims, 4 Drawing Sheets

MAGNETIC FIELD SENSOR WITH ENHANCED SENSITIVITY, INTERNAL BIASING AND MAGNETIC MEMORY

This application claims priority of U.S. Provisional Appln. No. 60/268702, filed Feb. 15, 2001.

BACKGROUND OF THE INVENTION

Magneto-impedance (MI) is a classical electromagnetic effect occurring in all soft magnetic conductors where a strong skin effect is present [1]. The skin depth depends on the magnetic permeability and resistivity of the conducting material and on the frequency, $\omega$, of the current flowing through the conductor. For higher frequency and permeability, the cross-section of the conductor traversed by an a.c. current diminishes; this is equivalent to an increase in the wire impedance. This current also produces a circumferential magnetic field, which magnetizes the conductor in a thin layer under the surface, orienting its spines in a circumferential direction with respect to the wire axis. When a longitudinal d.c. magnetic field, H, is applied to the wire, the spins will rotate toward this field direction and the circumferential permeability changes. The skin depth, and thus the wire impedance, are changed. The relative change in the wire impedance, which can now be viewed as depending on the static field, via permeability, constitutes the MI effect, which is usually defined as [2]:

$$Z(\omega,H)/Z(\omega,H)=[[Z(H)-Z(H_{sat})]/Z(H_{sat})]\times 100 \; (\%).$$

Near-zero magnetostriction magnetic wires have already been used for magnetic field sensing. Related art describes magneto-impedance sensing elements made of FeCoSiB amorphous wires prepared by quenching a jet of molten material in a rotating layer of water, known as "Unitika" wires [3]. For example, U.S. Pat. No. 5,994,899 describes such an element, having near-zero magnetostriction, which is supplied with a dc-biased alternating current to produce a voltage drop across the element, said voltage drop depending on the strength of an applied magnetic field. In such embodiment, the properties of the sensing element are well defined after casting and are not tunable for particular sensitivity. The fine tuning is normally provided by complex electronic circuitry.

Magneto-transport effects in metals are normally non-linear around zero magnetic field, and their response is usually a parabola centered around the field origin. Thus, in order to linearize the operation of any sensor using these effects, said parabola must be displaced with its linear part crossing the zero field axis. This operation is known as the biasing of the sensing element. Bias magnetic fields may be provided by coils wound around the element (U.S. Pat. No. 6,121,770), or by permanent magnets located in the vicinity of the element (U.S. Pat. No. 6,097,183). Moreover, biasing may occur as a result of thermo-mechanical treatments used to induce or change specific magnetic properties of the material forming the sensing element. For example, Unitika wires were found to exhibit a spiral magnetic anisotropy (the micro-magnetic equivalent of linearization) and a magneto-impedance vs. field sensitivity of 10%/Oe following the twisting of the wire (U.S. Pat. No. 5,994,899).

U.S. Pat. No. 6,069,475 describes a magneto-impedance sensor having as sensing element a short-circuited microstrip device having a soft magnetic wire as the upper conductor and a copper layer as the ground conductor. The magneto-impedance of two soft wires is used in a multi-vibrator-type of electronic circuit to measure the gradient of a magnetic field, as described in the U.S. Pat. No. 5,831,432.

Related art also describes amorphous wires cast by other methods than quenching in rotating water. For example, U.S. Pat. No. 5,003,291 describes melt extraction, a casting method where wires are extracted by a rotating wheel from a melted alloy. The molten material adheres to the wheel and quickly solidifies. This technique generates quenched-in tensile stresses which follow the radial directions of the temperature gradients during solidification [4]. In negative magnetostriction wires, the coupling of radial stresses to the magnetic spins induces a circumferential easy axis (the direction of minimum energy of spins) in the outer shell of the wire. Due to demagnetization, the easy axis is longitudinal in the inner core of the wire. The magnetization of the wire occurs through spin rotation in the outer shell and wall displacement in the inner core, the latter being associated to large Barkhausen jumps in the hysteresis loop [5]. The magnetic structure of melt-extracted wires is different from that of "Unitika" wires. Moreover, twisting and/or annealing of melt-extracted wires were found to significantly diminish the magneto-impedance effect in these wires.

SUMMARY OF THE INVENTION

We have discovered that magnetic sensors, based on the magneto-impedance effect and made of stress-sensitive, negative-magnetostriction amorphous wires, cast by melt extraction, exhibit unexpected and useful properties.

An object of an aspect of the present invention is to provide a simple method to obtain a sensing element with significantly enhanced sensitivity and, at the same time, to control the magnitude of said sensitivity.

An object of another aspect of the present invention is to provide a simple and practical method of internal linearization of the operation of said sensing element, thus eliminating the need for complex electronics and/or external biasing magnetic fields.

An another object of yet another aspect of the present invention is to obtain a memory element, with memory of its previous saturating magnetic state, based on the magneto-impedance effect in stress-sensitive, negative-magnetostriction amorphous wires, cast by melt extraction.

More particularly, this invention provides a magnetic field sensor comprising, as sensing element, a wire made of a stress-sensitive material, wherein said wire is submitted to a longitudinal tensile stress.

BRIEF DESCRIPTION OF THE DRAWINGS

Accordingly, two embodiments of this invention are illustrated in the accompanying drawings, in which like numerals denote like parts throughout the several views, and in which.

DETAILED DESCRIPTION OF THE PREFERRED EMBODIMENT

The present invention uses as sensing element an as-cast, melt-extracted, stress-sensitive, negative-magnetostriction, CoFeSiBMn wire, and submits said wire to a carefully tuned longitudinal tensile stress. Magneto-elastic interactions, involving this stress and the stresses quenched in during wire casting, change the magnetic structure of said wire and lead to a MI vs. field characteristic which splits around the field origin, and also shows a jump induced by the switching of the magnetization in the inner core of the wire (FIG. 2B). This Figure actually shows that the AB linear segment of the wire characteristic under stress has a MI/magnetic field slope much steeper than that of the characteristic without stress shown in FIG. 1B. The magnitude of said sensitivity (the slope of the linear segment) depends on the magnitude of the stress which is applied to the wire.

Additionally, the proposed structure eliminates the necessity of means for applying an external bias magnetic field. In fact, the segment AB of the MI characteristic shown in FIG. 2B crosses the zero field axis, which means that, by placing the wire under tension, we also achieve the linearization of the sensor. The easy axis in the superficial layer tilts from the circumferential direction. The sensor according to the present invention can detect both the sign of the magnetic field and its magnitude.

A change in the sign of the initial direction of wire saturation will result in symmetrically mirrored MI responses of the wire under stress (FIG. 2B, dotted). Such behaviour is unexpected in soft magnetic materials and indicates that, when the initial saturating magnetic field is removed, stress-sensitive, negative-magnetostriction amorphous wires, cast by melt extraction, remember the direction, positive (denoted by 7 in FIG. 2A) or negative, of said saturating field. It should be noted that application of a tensile longitudinal stress to near-zero or positive magnetostriction amorphous wires will not result in the characteristics shown in FIG. 2B.

We believe that melt-extracted negative-magnetostriction wires under stress exhibit the highest sensitivity known for magneto-transport-based detectors. For example, we have obtained, in a 35 mm-long and 35 μm in diameter as-cast CoFeSiBMn wire, submitted to a tensile force of 0.1 N, corresponding to a 10 g mass suspended to the wire, which generates in each cross-section of the wire a tensile stress of 100 MPa, a MI vs. field sensitivity of up to 750%/Oe. Said wire was supplied with an 1 mA-strong a.c. current of 10 MHz frequency by an impedance-meter, which also measured the magneto-impedance vs. field characteristic of the sensing element.

Figure 1A:
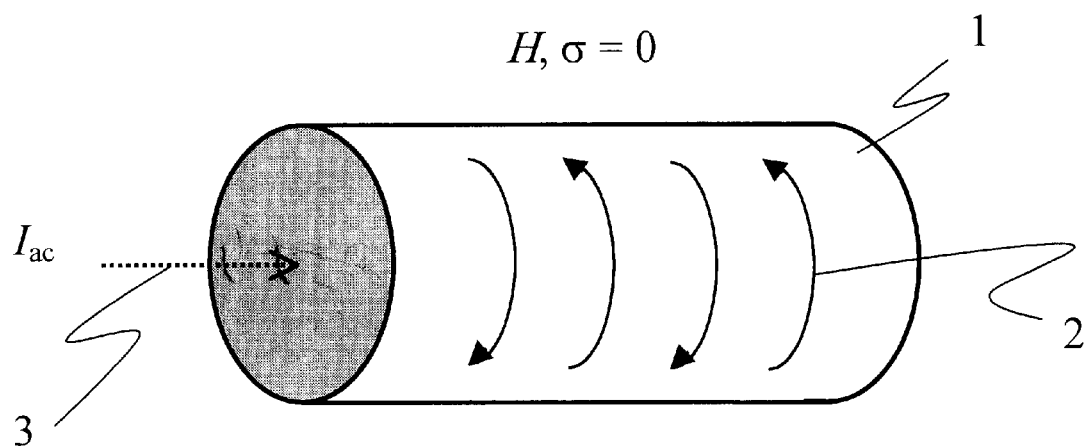
FIG. 1A is an explanatory chart showing the circumferential easy axis amorphous wire without stress according to the related art.

FIG. 1A shows the magnetic structure of an amorphous wire according to the related art. Numeral 1 denotes this wire having a circumferential easy axis. Numeral 2 denotes one circumferential magnetic moment in the said wire, and numeral 3 denotes the direction of the a.c. sensing current passing through said wire. Symbol $I_{ac}$ denotes the amplitude of this current, symbol H denotes the magnetic field to be detected by the wire, and symbol α denotes the biasing tensile stress.

Figure 1B:
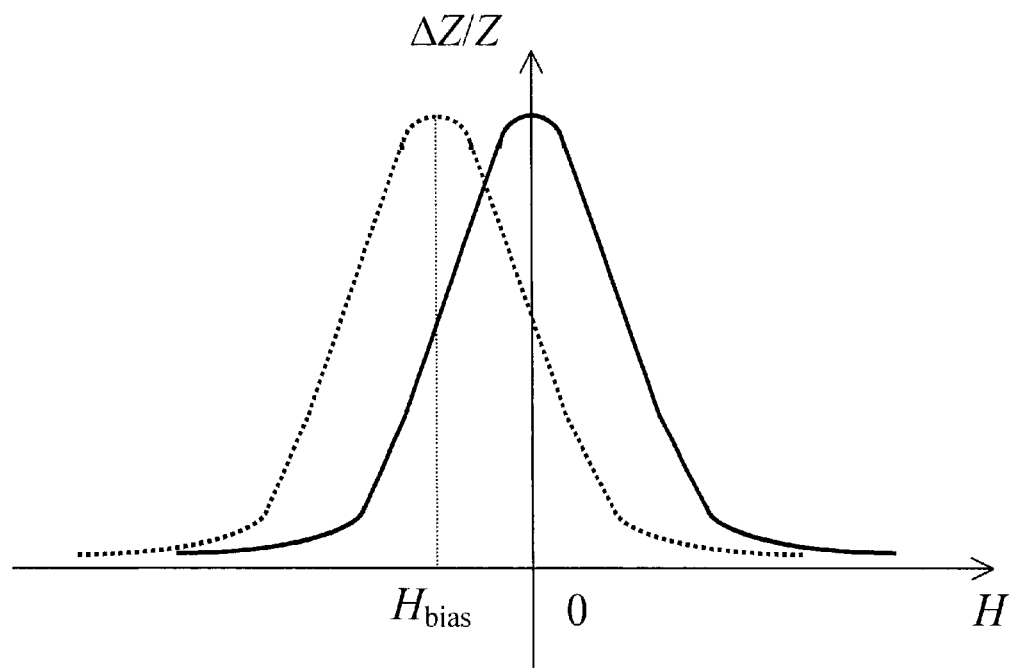
FIG. 1B shows the MI vs. magnetic field characteristic of the circumferential easy axis amorphous wire without stress according to the related art.

FIG. 1B shows the MI vs. magnetic field characteristics of an amorphous wire in absence of stress, according to the related art. The characteristic of an unbiased wire is shown in full line, whereas that of a biased wire is shown in broken line.

Figure 2A:
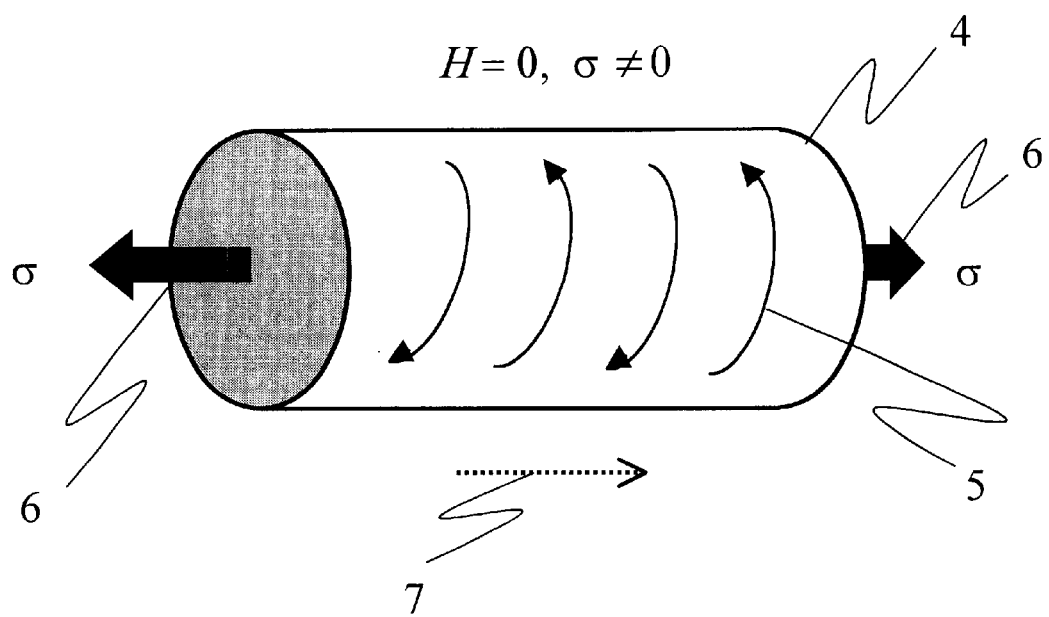
FIG. 2A is an explanatory chart showing the amorphous wire under tensile stress according to the present invention.
Figure 2B:
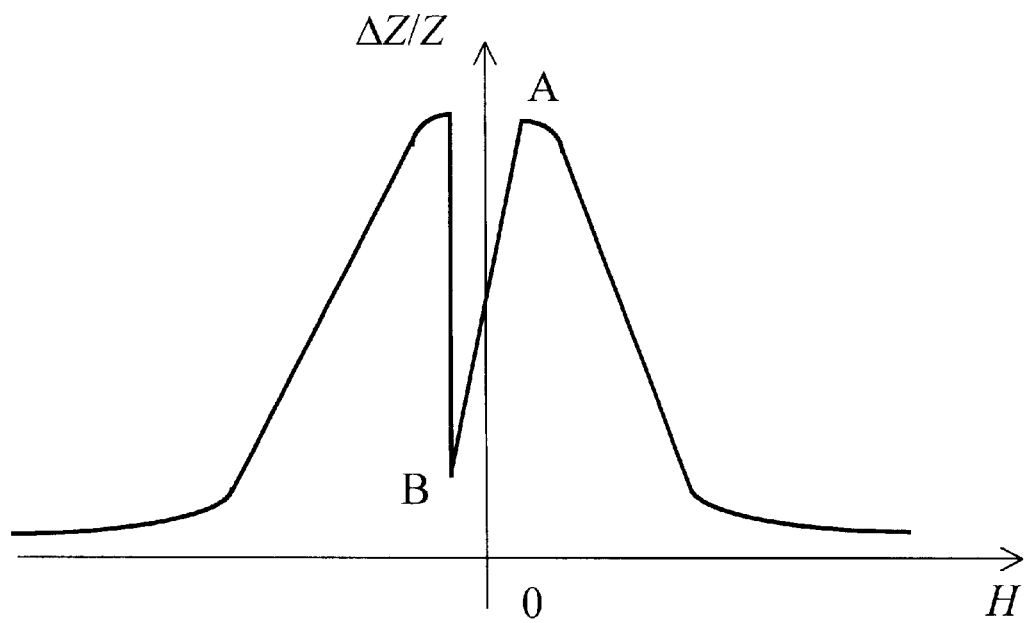
FIG. 2B shows the MI vs. magnetic field split characteristics of the amorphous wire under tensile stress according to the present invention.

FIG. 2A shows the magnetic structure of the melt-extracted negative-anisotropy amorphous wire under stress according to the present invention. Numeral 4 denotes said wire having a tilted easy axis, induced by the combined effect of the initial saturation and of the stress. Numeral 5 denotes one tilted magnetic moment in the said wire, and numeral 6 denotes the stress direction. Numeral 7 denotes the direction of the positive initial saturation of the wire. Symbol H denotes the magnetic field to be detected and symbol α denotes the biasing longitudinal tensile stress.

FIG. 2B shows in full line the MI vs. magnetic field characteristic of the wire under stress, following positive saturation, which is split and shows near the field origin a jump in MI, according to the present invention. The slope of the AB linear segment crossing the zero field axis is more than tenfold steeper than that of the MI characteristic without stress shown in FIG. 1B. The MI vs. field characteristic, following negative saturation, is shown in broken line. The Z/Z values recorded for wires with positive saturation are different at each field from those recorded for wires with negative saturation (memory element).

Embodiment 1

Figure 3:
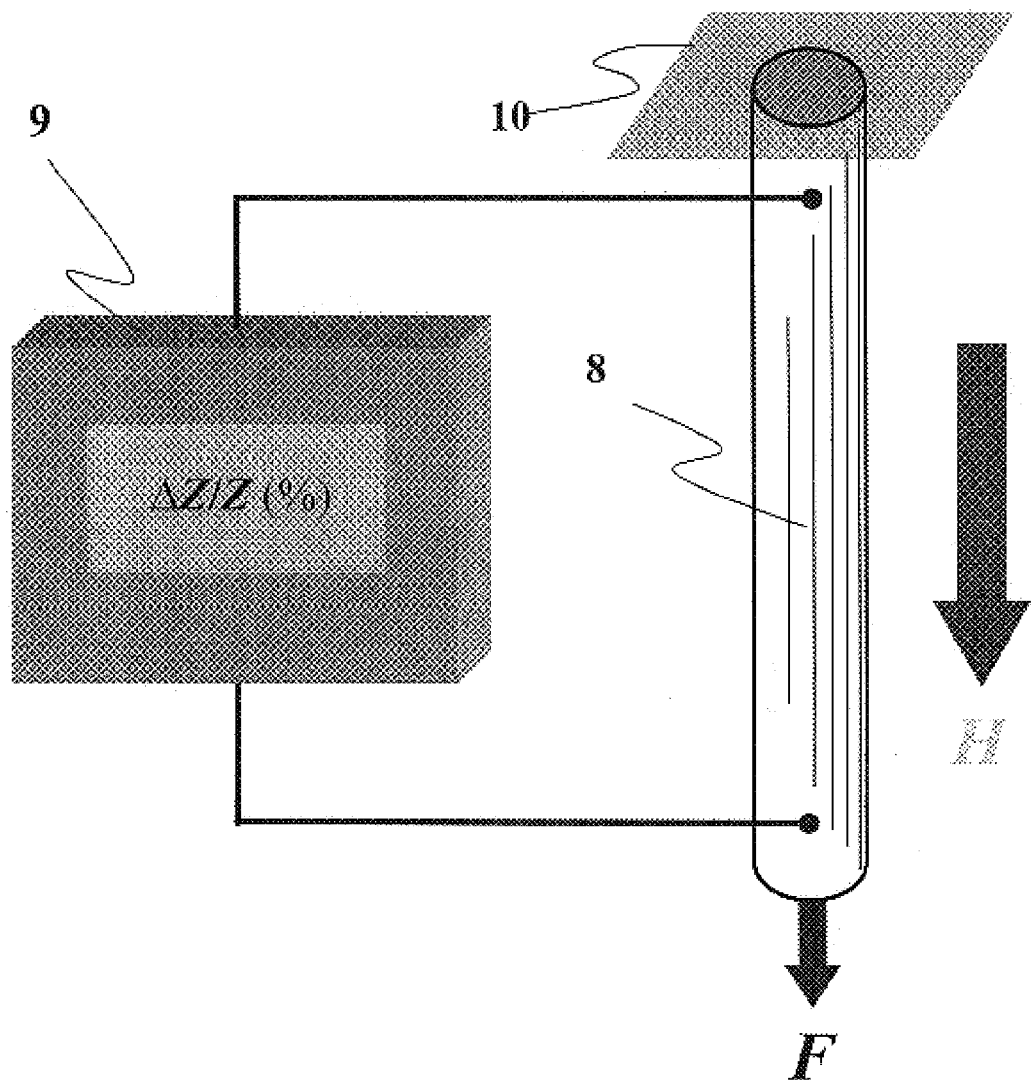
FIG. 3 is a circuit diagram of the magnetic field sensing apparatus according to the present invention.

FIG. 3 shows the structure of the magnetic field sensor used in a first embodiment of the present invention. Numeral 8 denotes the stress-sensitive, negative-magnetostriction, melt-extracted amorphous wire under stress, which is the sensing element. The wire 8 is connected to conventional electronic circuitry. Numeral 9 denotes such a circuitry, for example an impedance-meter. Numeral 10 denotes the mechanism which permits fixing one end of the wire and applying a tensile force to the free end of the wire. Symbol H denotes the magnetic field to be detected by the wire 8. Symbol F denotes the biasing force which enhances the sensitivity and linearizes the magnetic sensor. Symbol Z/Z denotes the relative change in the wire impedance detected by the circuitry when the strength of the magnetic field changes.

Figure 4:
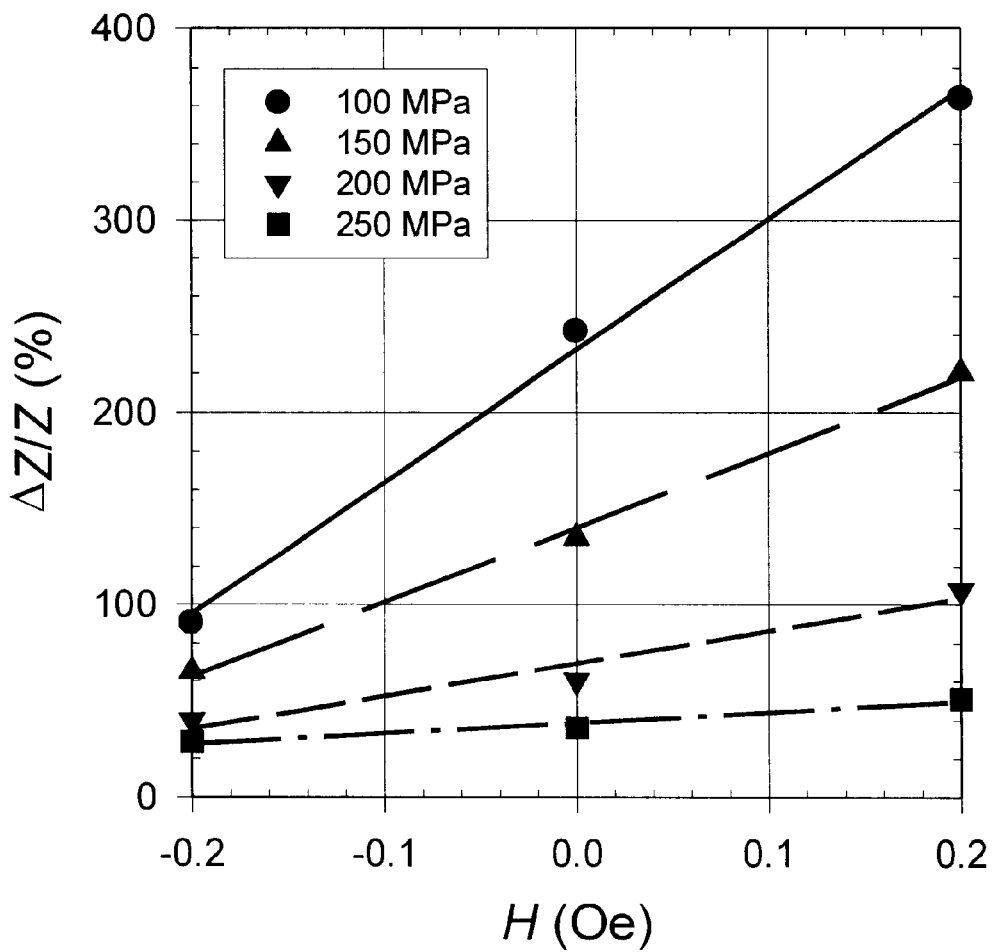
FIG. 4 is a graph showing the magneto-impedance vs magnetic field positive saturation characteristics of the apparatus when the sensing element is a melt-extracted negative-magnetostriction amorphous wire 35 mm-long, 35 μm in diameter and submitted to a biasing tensile stress in the 90–300 MPa range. The sensitivity shows a maximum of 750%/Oe when the tensile stress is about 100 MPa.

FIG. 4 shows the magneto-impedance vs magnetic field positive saturation characteristics of the apparatus in Embodiment 1, where the sensing element is a melt-extracted, stress-sensitive, negative-magnetostriction wire, 35 mm-long and 35 μm in diameter, submitted to a biasing tensile stress in the 90–300 MPa range. The sensitivity of detecting the magnetic field reaches a maximum of 750%/Oe when the tensile stress is about 100 MPa. All the characteristics are straight lines passing through the H=0 axis, which means that tensile stress is very effective as a biasing method for said wires. Moreover, the sensitivity can be adjusted by fine tuning of the applied stress, using strictly mechanical means (screws or other mechanisms) and/or electromechanical means (piezoelectric or magnetostrictive actuators).

Embodiment 2

A second embodiment of the present invention may use two such sensing elements mounted in a bridge or half-bridge configuration, which shows the advantage of further increasing the magneto-impedance vs. field sensitivity.

The sensors in both first and second embodiments can be used as position detectors and read-back magnetic heads or as tag detectors in anti-shoplifting systems.

The sensor in the first embodiment can also be used as stress detector. A d.c. magnetic field must be applied as bias along the wire under stress. The magneto-impedance vs. stress sensitivity of the detector presented in FIG. 4 is about 4%/MPa (in zero filed) for biasing d.c. fields of maximum 1 Oe, whereas its linearity domain ranges from 50 to 250 Mpa.

While two embodiments of this invention have been illustrated in the accompanying drawings and described hereinabove, it will be evident to those skilled in the art that changes and modifications may be made therein without departing from the essence of this invention, as set forth in the appended claims.

The embodiments of the invention in which an exclusive property or privilege is claimed are defined as follows:

1. A magnetic field sensor comprising, as sensing element, a negative-magnetostriction amorphous wire made of a stress-sensitive material, wherein said wire is submitted to a longitudinal tensile stress of less than 300 MPa.

2. A magnetic field sensor, according to claim 1, wherein said sensing element under stress is a melt-extracted wire.

3. A magnetic field sensor, according to claim 1, wherein said sensing element under stress is capable of linear detection of magnetic fields.

4. A magnetic field sensor, according to claims 1, wherein said sensing element under stress has memory of its last saturation magnetization state.

5. A method for increasing sensitivity in detecting magnetic fields, wherein a wire according to claim 1 is tensed in the longitudinal direction in order to split around the field origin its MI vs field characteristic.

6. The method claimed in claim 5, in which the magnitude of the sensitivity for the detection of magnetic fields is controlled by fine tuning the magnitude of the longitudinal tensile stress in order to change the slope of the linear segment of the MI vs field characteristic.

7. A method for linearizing the detection of magnetic fields, comprising: inducing a vanishing helical anisotropy in the wire claimed in claim 1, through tensile stress, which results in a linear MI vs field characteristic passing through the zero field axis.

8. A method of obtaining a memory element, in which the sensing element claimed in claim 1, when under stress, has memory of its last saturation magnetization state.

9. A method of obtaining a memory element, in which the sensing element claimed in claim 4, when under stress, has memory of its last saturation magnetization state.

10. A method for linearizing the detection of magnetic fields, comprising: inducing a vanishing helical anisotropy in the wire claimed in claim 3, through tensile stress, which results in a linear MI vs. field characteristic passing though the zero field axis.

11. The magnetic field sensor according to claim 1, wherein said wire is submitted to a longitudinal tensile stress of about 100 MPa.

12. The magnetic field sensor according to claim 1, wherein said wire is comprised of amorphous CoFeSiBMn alloy.

13. A magnetic field sensor comprising, as sensing element, a negative-magnetostriction, amorphous wire made of a stress-sensitive material, wherein said wire is submitted to a stress comprising only longitudinal tensile stress of less than 300 MPa.

* * * * *